United States Patent
Kang et al.

(10) Patent No.: US 7,161,864 B2
(45) Date of Patent: Jan. 9, 2007

(54) BIT REFRESH CIRCUIT FOR REFRESHING REGISTER BIT VALUES, INTEGRATED CIRCUIT DEVICE HAVING THE SAME, AND METHOD OF REFRESHING REGISTER BIT VALUES

(75) Inventors: Won-Sik Kang, Seoul (KR); Jae-Goo Lee, Yongin-si (KR); Jae-Hyuck Woo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 49 days.

(21) Appl. No.: 11/123,263

(22) Filed: May 7, 2005

(65) Prior Publication Data

US 2005/0286309 A1   Dec. 29, 2005

(30) Foreign Application Priority Data

Jun. 24, 2004   (KR) ..................... 10-2004-0047621

(51) Int. Cl.
*G11C 7/00* (2006.01)
*G11C 8/00* (2006.01)

(52) U.S. Cl. ............ 365/222; 365/189.08; 365/189.12; 365/233

(58) Field of Classification Search ................ 365/222, 365/189.08, 189.12, 233
See application file for complete search history.

(56) References Cited

U.S. PATENT DOCUMENTS

| | | | |
|---|---|---|---|
| 4,430,737 A | | 2/1984 | Beranger et al. |
| 5,905,392 A | * | 5/1999 | Chun .......................... 327/198 |
| 6,628,559 B1 | * | 9/2003 | Shimizu et al. ............. 365/222 |
| 6,795,363 B1 | * | 9/2004 | Nakashima et al. ........ 365/222 |

FOREIGN PATENT DOCUMENTS

| | | |
|---|---|---|
| JP | 53003710 | 1/1978 |
| JP | 10260905 | 9/1998 |
| KR | 0032802 | 5/1999 |

OTHER PUBLICATIONS

English Abstract.
English Abstract.
English Abstract.

* cited by examiner

*Primary Examiner*—Son T. Dinh
(74) *Attorney, Agent, or Firm*—F. Chau & Associates, LLC

(57) ABSTRACT

There is provided a bit refresh circuit and method of checking errors in bit values of a register and refreshing the bit values, and an integrated circuit comprising the bit refresh circuit. The integrated circuit includes a refresh unit checking whether or not the bit values of the register storing data used to control the operations of a logic circuit changes due to external noise. The refresh unit checks bit-by-bit whether or not there are errors in the bit values due to the external noise. If there are errors in the bit values of the register, the data of the associated bit values stored in a memory are refreshed into the register.

20 Claims, 3 Drawing Sheets

BIT REFRESH CIRCUIT FOR REFRESHING REGISTER BIT VALUES, INTEGRATED CIRCUIT DEVICE HAVING THE SAME, AND METHOD OF REFRESHING REGISTER BIT VALUES

BACKGROUND OF THE INVENTION

This application claims priority from Korean Patent Application No. 2004-47621, filed on Jun. 24, 2004, in the Korean Intellectual Property Office, the disclosure of which is incorporated herein in its entirety by reference.

1. Field of the Invention

The present invention relates to an integrated circuit device, and more particularly, to a bit refresh circuit for refreshing register bit values, an integrated circuit device having the bit refresh circuit, and a method of refreshing register bit values.

2. Description of Related Art

FIG. 1 is a block diagram showing a conventional integrated circuit device 100 having a register. The integrated circuit device 100 comprises a memory 110, a register 120, and a logic circuit 130. The register 120 stores data for controlling the logic circuit 130 or digital values for setting operations of the logic circuit 130. The logic circuit 130 receives bit values output from the register 120 and various control signals, performs given operations, and outputs operation results. The memory 110 outputs data used to set bit values of the register 120. The memory 110 may be a ROM such as an erasable programmable read only memory (EPROM) and an electrically erasable programmable read only memory (EEPROM) or a DRAM. The memory 110 may be provided inside or outside the integrated circuit device 100.

The integrated circuit device 100 includes, for example, a liquid crystal display (LCD) driver integrated circuit (IC) used for a mobile apparatus. In addition, the integrated circuit device 100 may include a DRAM and a digital signal processing (DSP) chip comprising the register 120 for setting bit values by using data output from the memory 110.

The logic circuit 130 of the integrated circuit device 100 may erroneously operate due to external noise. For example, an LCD driver IC of a mobile device such as a mobile phone may be affected with external noise resulting from electrostatic defect (ESD), power bouncing, or a flash of light. In turn, the external noise may change bit values used to set a common voltage for a register or bit values used for gamma correction. As a result, errors on the screen of an LCD may occur due to an erroneous operation of an internal logic circuit. To solve the problem, there is proposed an approach for providing an ESD protection diode in the LCD driver IC. In addition, there is proposed another approach for periodically refreshing the bit values set in the register. However, in a case where the bit values are directly periodically refreshed from an external host to the register, it is difficult to refresh the bit values bit-by-bit for plural ICs in which bit values of the register are not uniform. Moreover, in a case where data stored in the memory 110 is periodically refreshed and applied to the register 120, there is a problem of reducing the lifetime of the memory 110 since durability of the memory 110 is deteriorated.

SUMMARY OF THE INVENTION

Therefore, a need exists for a bit refresh circuit for checking errors in the bit values of a register and refreshing the bit values to prevent an erroneous operation of an integrated circuit due to noise of a logic circuit in the integrated circuit.

A need also exists for an integrated circuit comprising a bit refresh circuit for checking errors in the bit values of a register and refreshing the bit values.

According to an aspect of the present invention, there is provided a bit refresh circuit comprising: a first latch circuit; a second latch circuit; a determination circuit; a flip-flop; an OR logic circuit; and a NAND logic circuit. The first latch circuit receives an input signal, latching the input signal in response to a set signal and outputs a first latch signal. The second latch circuit receives the input signal, latching an inverted signal of the input signal in response to the set signal and outputs a second latch signal. The determination circuit generates a refresh determination signal by using the first and second latch signals. The flip-flop receives the refresh determination signal, latches the refresh determination signal in response to a refresh clock signal, and outputs the latched refresh determination signal as a determination result signal. The OR logic circuit performs an OR operation on a refresh verification signal and the determination result signal and outputs an OR operation result signal. The NAND logic circuit performs a NAND operation on an initial signal and the OR operation result signal and outputs the NAND operation result signal as the set signal.

The flip-flip may reset the determination result signal to a first logic state in response to a reset signal, wherein the NAND logic circuit may set the set signal to a second logic state in response to the initial signal being in the first state when the determination result signal is reset, and wherein the first latch circuit may output the first latch signal as a bit signal initially set to a register in response to the set signal being in the second logic state.

The determination circuit may determine a logical state of the refresh determination signal depending on whether or not the second latch signal is equal to an inverted signal of the first latch signal, wherein, in response to the refresh verification signal being in the first logic state when the refresh determination signal is in the first logic state, the first latch circuit may output the first latch signal as a to-be-refreshed bit signal, and wherein, when the refresh determination signal is in the second logic state, the first and second latch circuits may be maintained in the previous states.

The determination circuit may determine the logic state of the refresh determination signal every period of the refresh clock signal.

According to another aspect of the present invention, there is provided an integrated circuit device comprising: a refresh unit; a register; and a logic circuit. The refresh unit receives input signals, outputs initially-set bit signals, and periodically checks the initially-set bit signals and outputs a signal equal to each of the initially-set bit signals as a to-be-refreshed bit signal for each bit if states of the initially-set bit signals are different from initially set states. The register receives the initially-set bit signals to set each of the bit signals, receives the to-be-refreshed bit signals to set the bit signals again, and outputs the set bit signals as control signals. The logic circuit performs a predetermined logic operation in response to the control signals and outputs a result of the logic operation.

According to another aspect of the present invention, there is provided a method of refreshing register bit values, comprising: receiving an input signal, latching the input signal in response to a set signal, and outputting a first latch signal; receiving the input signal, latching an inverted signal of the input signal in response to the set signal, and outputting a second latch signal; generating a refresh determination signal by using the first and second latch signals; receiving the refresh determination signal, latching the refresh determination signal in response to a refresh clock signal, and outputting the latched refresh determination signal as a determination result signal; performing an OR operation on a refresh verification signal and the determination result signal and outputting an OR operation result signal; and performing a NAND operation on an initial signal and the OR operation result signal and outputting the NAND operation result signal as the set signal.

According to another aspect of the present invention, there is provided a method of driving an integrated circuit, comprising: receiving input signals and outputting initially-set bit signals; periodically checking the initially-set bit signals and outputting a signal equal to each of the initially-set bit signals as a to-be-refreshed bit signal for each bit if states of the initially-set bit signals are different from initially set states; receiving the initially-set bit signals to set each of the bit signals, receiving the to-be-refreshed bit signals to set the bit signals again, and outputting the set bit signals as control signals; and performing a predetermined logic operation in response to the control signals and outputting a result of the logic operation.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
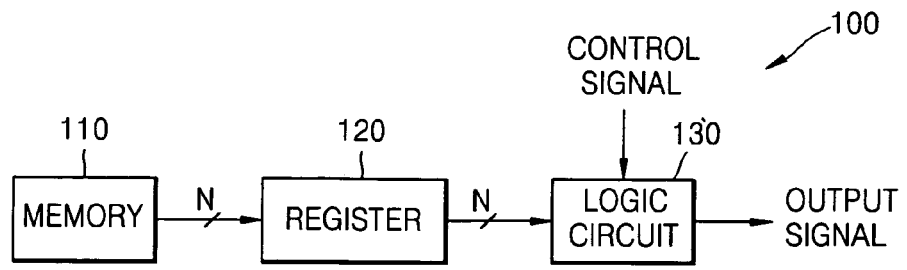
FIG. 1 is a block diagram showing a conventional integrated circuit device having a register.

Exemplary embodiments of the present invention will be described with reference to the accompanying drawings to explain the present invention in detail. In the drawings, the same reference numerals indicate the same elements.

Figure 2:
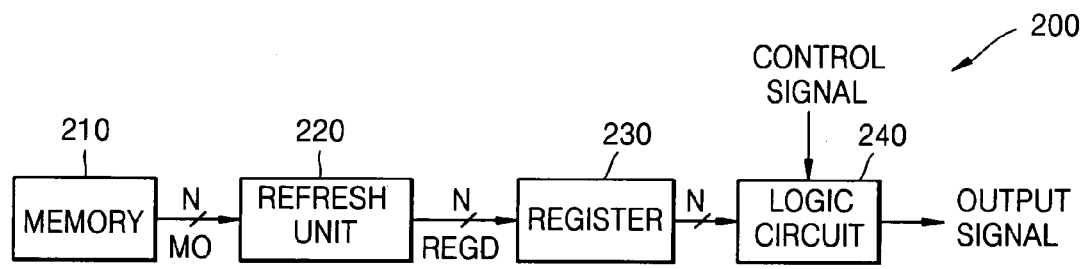
FIG. 2 is a block diagram showing an integrated circuit device having a refresh unit according to an embodiment of the present invention.

FIG. 2 is a block diagram showing an integrated circuit device 200 having a refresh unit according to an embodiment of the present invention. The integrated circuit device 200 comprises a memory 210, a refresh unit 220, a register 230, and a logic circuit 240. The integrated circuit device 200 includes, for example, a liquid crystal display (LCD) driver integrated circuit (IC) used for a mobile apparatus. In addition, the integrated circuit device 200 may include a DRAM and a digital signal processing (DSP) chip.

The memory 210 externally receives and stores input signals used to set bit values of the register 230. The memory 210 outputs the N input signals MO to the refresh unit 220. The memory 210 may be a ROM such as an erasable programmable read only memory (EPROM) and an electrically erasable programmable read only memory (EEPROM) or a DRAM. The memory 210 may be provided inside or outside the integrated circuit device 200.

Unlike the conventional integrated circuit device 100 where the input signals used to set bit values of the register 120 are directly output from the memory 110 to the register 120, the refresh unit 220 is disposed between the memory 210 and the register 230 according to the embodiment of the present invention to firstly check whether or not there is an error in the register bit values. If there is an error in the register bit values, the refresh unit 220 refreshes the bit values of the register 230.

Figure 3:
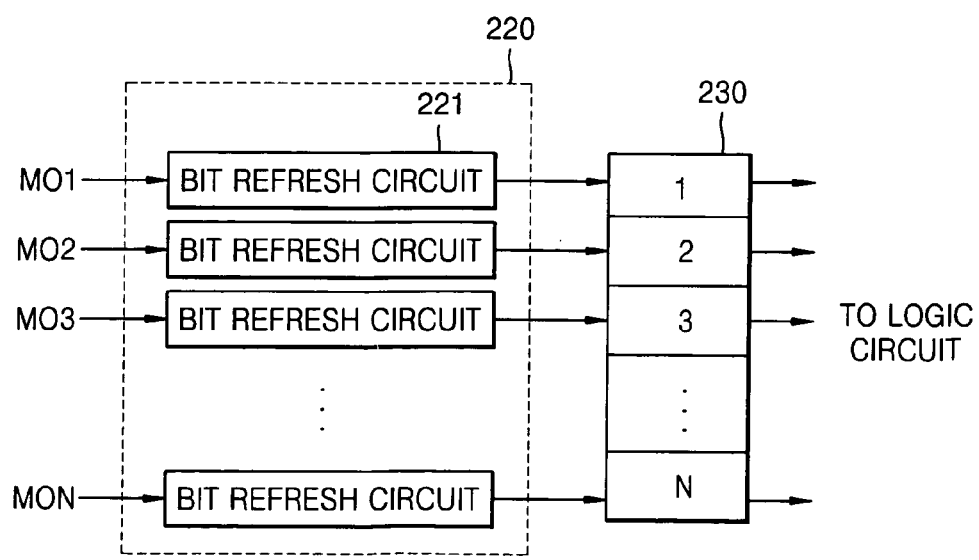
FIG. 3 is a block diagram showing the refresh unit and the register of FIG. 2.

FIG. 3 is a block diagram showing the refresh unit 220 and the register 230 of FIG. 2. The refresh unit 220 comprises N bit refresh circuits 221. The refresh unit 220 receives the N input signals MO and outputs initially-set bit signals used to initially set the register 230. After the register 230 is set with the initially-set bit signals, each of the bit refresh circuits 221 constituting the refresh unit 220 periodically determines whether or not the initially-set bit signals are maintained in initially set states. The refresh unit 220 receives the initially-set bit signals again and outputs the received initially-set bit signals as bit refresh signals to the register 230. The bit refresh circuits 221 constituting the refresh unit 220 will be described later in detail with reference to FIG. 4.

The register 230 stores register data REGD received from refresh unit 220. The register data REGD is used as data for controlling the logic circuit 240 or digital values for setting operations of the logic circuit 240. Firstly, the register 230 receives the initially-set bit signals from the refresh unit 220. After the register 230 is set with the initially-set bit signals, the register 230 sets the bit signals with bit refresh signals output from the refresh unit 220 to refresh the register 230. The register 230 outputs the set bit signals as control signals to the logic circuit 240. In response to the control signals output from the register 230, the logic circuit 240 performs predetermined logic operations and outputs operation results. The logic circuit 240 may receive various control signals in addition to the register data REGD output from the register 230 and perform the predetermined logic operations on the various control signals.

In the aforementioned integrated circuit device 200, an error in the data for setting the register 230 may occur due to external noise. For example, the external noise resulting from electrostatic defect (ESD), power bouncing, or a flash of light may affect the LCD driver ICs built in a mobile phone. As a result, the data for setting the register 230 such as common voltage setting bit values or gamma correcting bit values may vary. In turn, the logic circuit 240 controlled with the data for setting the register 230, that is, the register bit values, may erroneously operate so that the image quality of the LCD may be deteriorated. According to the present invention, the error in the data for setting the register 230 can be prevented by using the refresh unit 220.

Figure 4:
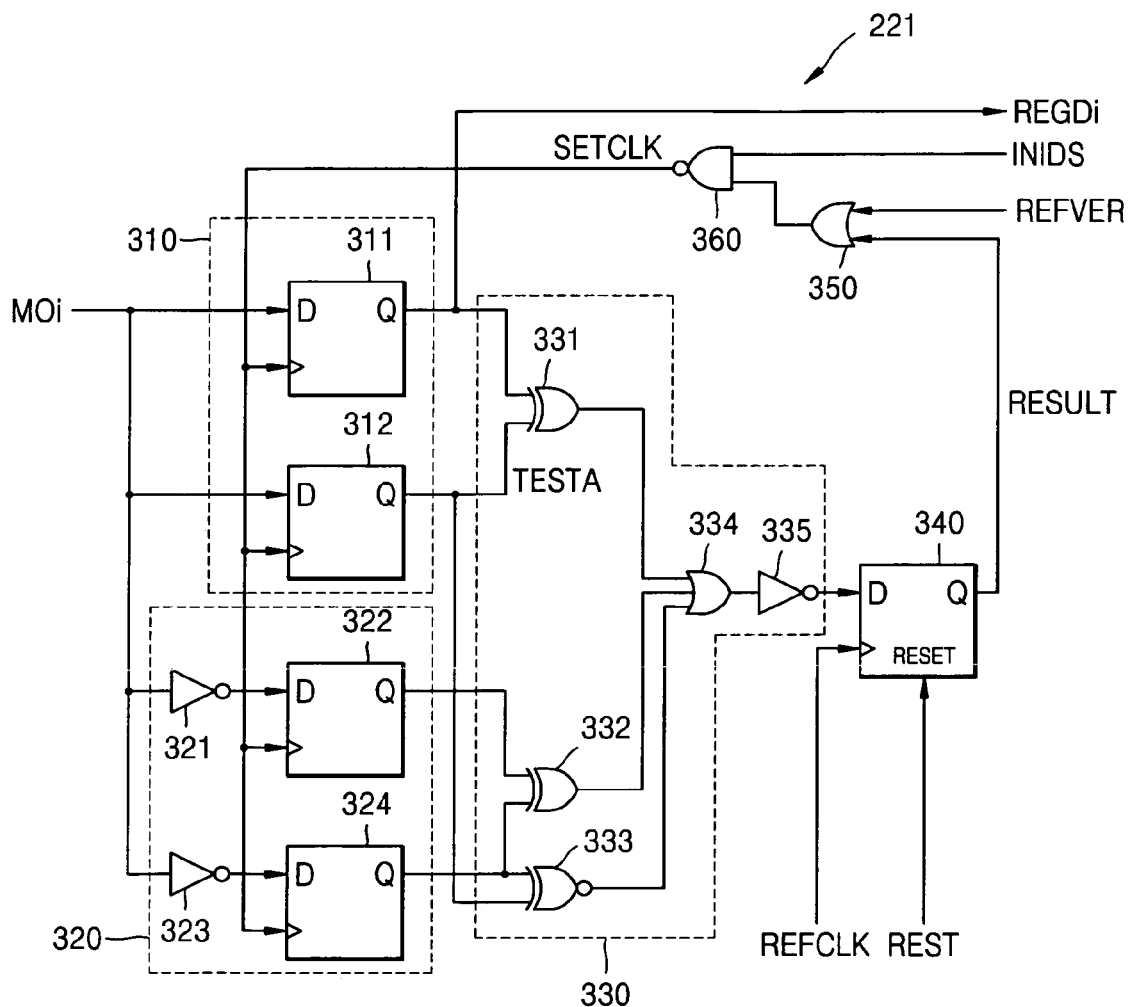
FIG. 4 is a block diagram showing one of the bit refresh circuits of FIG. 3.
Figure 5A:
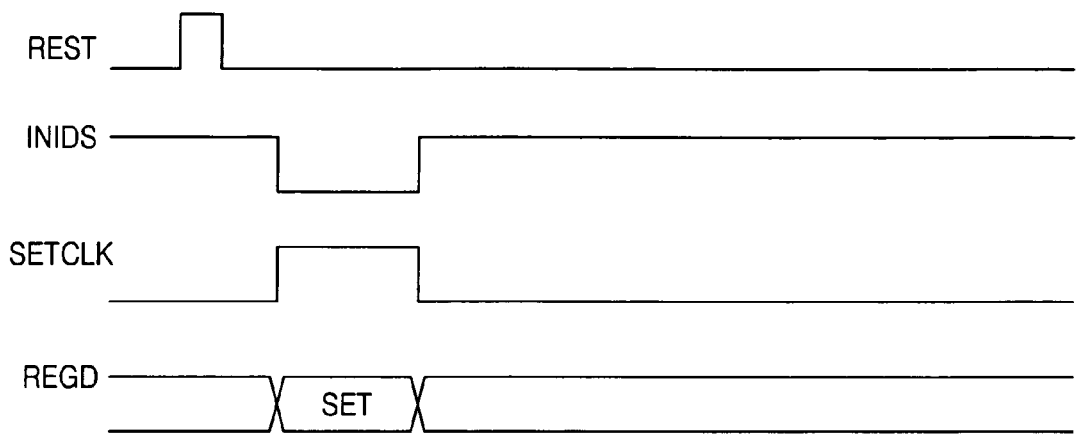
FIGS. 5a and 5b are timing charts for explaining initial operations and error checking operations of the bit refresh circuit of FIG. 4.
Figure 5B:
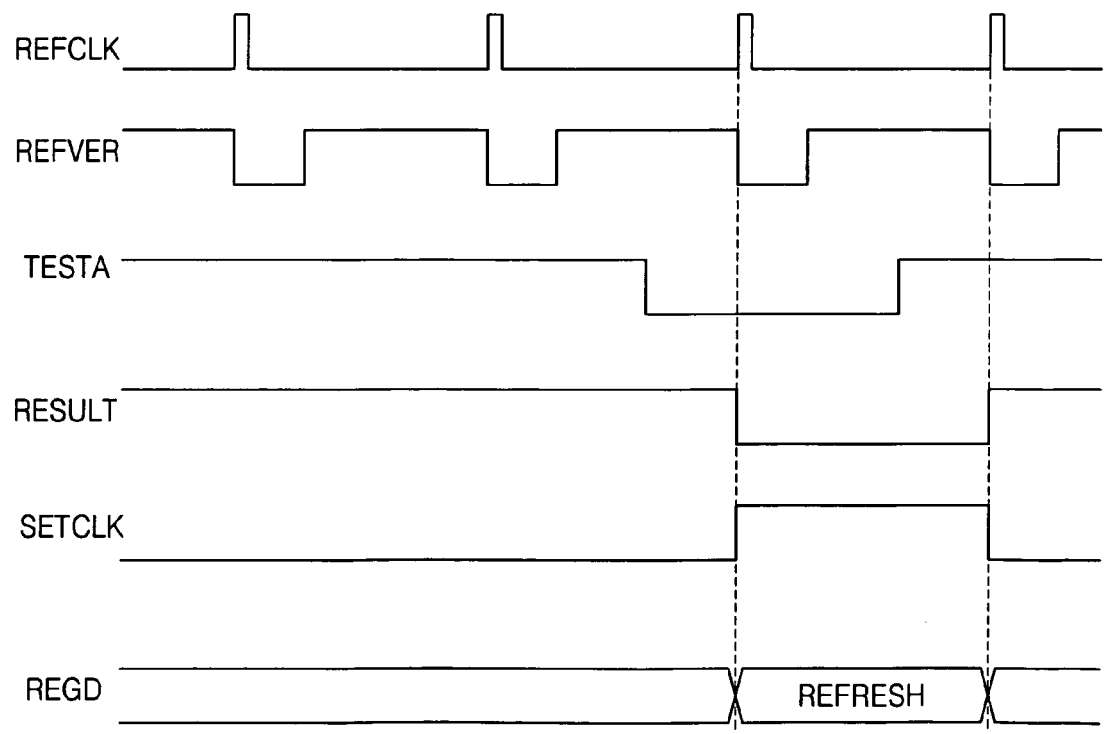

FIG. 4 is a block diagram showing one of the bit refresh circuits 221 of, FIG. 3. The bit refresh circuit 221 comprises a first latch circuit 310, a second latch circuit 320, a determination circuit 330, a flip-flop 340, an OR logic circuit 350, and a NAND logic circuit 360. FIGS. 5a and 5b are timing charts for explaining initial operations and error checking operations of the bit refresh circuit of FIG. 4.

The first latch circuit 310 receives one input signal MOi out of the input signals MO from the memory 210 of FIG. 2. In response to a set signal SETCLK, the first latch circuit 310 latches the input signal MOi and outputs a first latch signal. In particular, when the integrated circuit device 200 is initially powered on, if the set signal SETCLK is active, the first latch signal is output as an initially-set bit signal. As described above, when the refresh unit 220 comprising the bit refresh circuits 221 receives the N input signals MO in response to the set signal SETCLK and outputs the N initially-set bit signals to the register 230, the register 230 is set with the bit signals.

The first latch signal includes a pair of first and second determination reference signals which have the same logic states. More specifically, the first latch circuit 310 comprises a first flip-flop 311 outputting the first determination reference signal and a second flip-flop 312 outputting the second determination reference signal. The first flip-flop 311 receives the input signal MOi, which is one bit, latches the input signal MOi in response to the set signal SETCLK, and outputs the first determination reference signal. The second flip-flop 312 receives the input signal MOi, which is one bit, latches the input signal MOi in response to the set signal SETCLK, and outputs the second determination reference signal.

The second latch circuit 320 receives the input signal MOi, which is one bit, latches an inverted signal of the input signal MOi in response to the set signal SETCLK, and outputs a second latch signal. The second latch signal includes third and fourth determination reference signals, which have the logic states opposite to the logic states of the first and second determination reference signals. The third and fourth determination reference signals have the same logic states. The second latch circuit 320 comprises a first inverter 321, a third flip-flop 322, a second inverter 323, and a fourth flip-flop 324. The first inverter 321 and the third flip-flop 322 connected to the first inverter 321 are used to output the third determination reference signal. The second inverter 323 and the fourth flip-flop 324 connected to the second inverter 323 are used to output the fourth determination reference signal. More specifically, the first inverter 321 inverts the input signal MOi. The third flip-flop 322 latches the output signal of the first inverter 321 in response to the set signal SETCLK, and outputs the third determination reference signal. The second inverter 323 inverts the input signal MOi. The fourth flip-flop 324 latches the output signal of the first inverter 323 in response to the set signal SETCLK, and outputs the fourth determination reference signal.

The determination circuit 330 generates a refresh determination signal by using the first and second latch signals generated in the first and second latch circuits 310 and 320, respectively, to determine whether or not there is an error in the first and second latch signals. Although the determination circuit 330 can generate the refresh determination signal by using only the first and third determination reference signals as the first and second latch signals, respectively, the first and second determination reference signals and the third and fourth determination reference signals may be used as the first and second latch signals, respectively, to increase the accuracy of an error checking operation.

That is, if the first and third determination reference signals generated in the first and third flip-flops 311 and 322, respectively, have different logic states, the bit signal initially set to the register 230 is determined to be normally maintained, so that the determination circuit 330 can generate the refresh determination signal having the second logic state. If not, the determination circuit 330 can generate the refresh determination signal having the first logic state. Like this, checking the two signals, that is, the first and third determination reference signals, may result in erroneous determination that the bit signal initially set to the register 230 is normally maintained even in a case where there are errors in both of the two signals. Therefore, to increase accuracy of the error checking operation, as shown in FIG. 4, the determination circuit 330 uses the first to fourth determination reference signals generated in the first to fourth flip-flops 311, 312, 322, and 324, respectively. The determination circuit 330 generates the refresh determination signal being at the second logic state in a case where the first and second determination reference signals have the same logic states, a case where the third and fourth determination reference signals have the same logic states, and a case where one of the first and second determination reference signals and one of the third and fourth determination reference signals have different states.

To perform the aforementioned operations, as shown in FIG. 4, the determination circuit 330 comprises a first exclusive OR (XOR) logic circuit 331, a second XOR logic circuit 332, an exclusive NOR (XNOR) logic circuit 333, an OR logic circuit 334, and an inverter 335.

The first XOR logic circuit 331 performs a first XOR operation on the first and second determination reference signals and outputs a first XOR operation result signal. The second XOR logic circuit 332 performs a second XOR operation on the third and fourth determination reference signals and outputs a second XOR operation result signal. The XNOR logic circuit 333, performs an XNOR operation on one of the first and second determination reference signals and one of the third and fourth determination reference signals and outputs an XNOR operation result signal. The OR logic circuit 334 performs an OR operation on the first XOR operation result signal, the second XOR operation result signal, and the XNOR operation result signal and outputs an OR operation result signal. The inverter 335 inverts the OR operation result signal and outputs the inverted OR operation result signal as the refresh determination signal.

On the other hand, the flip-flop 340 receives the refresh determination signal output from the determination circuit 330, latches the refresh determination signal in response to a refresh clock signal REFCLK, and outputs a determination result signal RESULT. The output of the flip-flop 340 is reset to the first logic state by the reset signal REST. The OR logic circuit 350 performs an OR operation on a refresh verification signal REFVER and the determination result signal RESULT and outputs the OR operation result signal. The NAND logic circuit 360 performs a NAND operation on an initial signal INIDS and the OR operation result signal and outputs a NAND operation signal as the aforementioned set signal SETCLK. It is assumed that the refresh clock signal REFCLK, the reset signal REST, the refresh verification signal REFVER, and the initial signal INIDS are generated by a predetermined control unit (not shown).

For example, in an initial operation of the bit refresh circuit 221, as shown in FIG. 5a, when the reset signal REST is activated, the flip-flop 340 resets the determination result signal RESULT to the first logic state. When the determination result signal RESULT is reset to the first logic state, the initial signal INIDS is in the first logic state. Accordingly, the NAND logic circuit 360 allows the set signal SETCLK to be in the second logic state. Therefore, in response to the set signal SETCLK being in the second logic state, the first latch circuit 310 outputs the first latch signal, that is, the first or third determination reference signal, as the bit signal REGDi to be initially-set to the register 230.

Like this, after the bit signals REGDi are set to the register 230, as shown in FIG. 5b, in the error checking operation of the bit refresh circuit 221, it is determined whether or not each of the bit signals REGDi to be initially set to the register 230 is maintained in the initially set state by checking the bit signal REGDi to be initially set to the register 230 according to the refresh clock signal REFCLK, which is periodically activated. In the error checking operation of the bit refresh circuit 221, the initial signal INIDS is maintained in the second logic state. In FIG. 5b, when the refresh clock signal REFCLK is activated, the refresh verification signal REFVER having a larger margin than the refresh clock signal REFCLK is in the first logic state. At this time, if the determination result signal RESULT obtained from the flip-flop 340 latching the refresh determination signal is in the second logic state, since the set signal SETCLK is in the first logic state, the first and second latch circuits 310 and 320 are not refreshed and output the previous states. In addition, when the refresh verification signal REFVER is in the first logic state, if the determination result signal RESULT obtained from the flip-flop 340 latching the refresh determination signal is in the first logic state, since the set signal SETCLK is in the second logic state, the first latch circuit 310 outputs the first latch signal, that is, the first or second determination reference signal, as the bit signal REGDi to be refreshed to the register 230. FIG. 5b shows a case where the second determination reference signal TESTA output from the second flip-flop 312 is normally in the second state and is changed into the first state due to noise.

As described above, according to an embodiment of the present invention, an integrated circuit 200 comprises a refresh unit 220 for determining whether or not the bit values of a register 230 for storing data used to control operations of a logic circuit 240 change due to external noise. The refresh unit 220 checks whether or not there is an error in each of the bit values of the register 230 due to the noise. If there is an error in a bit value, the data of the associated bit stored in a memory 21 is refreshed to the register 230.

As described above, in an integrated circuit 200 according to an embodiment of the present invention, in a case where there are errors in bit values of a register 230, since only the associated bit values are refreshed, it is possible to more efficiently solve the problem of short life time of a memory 210 than a conventional one. In addition, since the bit values of the register 230 are stably applied to a logic circuit 240, it is possible to prevent an erroneous operation of the integrated circuit 200.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bit refresh circuit for refreshing register bit values comprising:
    a first latch circuit receiving an input signal, latching the input signal in response to a set signal, and outputting a first latch signal;
    a second latch circuit receiving the input signal, latching the inverted input signal in response to the set signal, and outputting a second latch signal;
    a determination circuit generating a refresh determination signal by using the first and second latch signals;
    a flip-flop receiving the refresh determination signal, latching the refresh determination signal in response to a refresh clock signal, and outputting the refresh determination signal as a determination result signal;
    an OR logic circuit performing an OR operation on a refresh verification signal and the determination result signal and outputting an OR operation result signal; and
    a NAND logic circuit performing a NAND operation on an initial signal and the OR operation result signal and outputting the NAND operation result signal as the set signal.

2. The bit refresh circuit according to claim 1,
    wherein the flip-flip resets the determination result signal to a first logic state in response to a reset signal,
    wherein the NAND logic circuit sets the set signal to a second logic state in response to the initial signal being in the first state when the determination result signal is reset, and
    wherein the first latch circuit outputs the first latch signal as a bit signal initially-set to a register in response to the set signal being in the second logic state.

3. The bit refresh circuit according to claim 1,
    wherein the determination circuit determines a logical state of the refresh determination signal depending on whether or not the second latch signal is equal to an inverted signal of the first latch signal,
    wherein, in response to the refresh verification signal being in the first logic state when the refresh determination signal is in the first logic state, the first latch circuit outputs the first latch signal as a to-be-refreshed bit signal, and
    wherein, when the refresh determination signal is in the second logic state, the first and second latch circuits are maintained in the previous states.

4. The bit refresh circuit according to claim 3, wherein the determination circuit determines the logic state of the refresh determination signal every period of the refresh clock signal.

5. The bit refresh circuit according to claim 1,
    wherein the first latch circuit generates first and second determination reference signals in the same logic states by using different logic circuits and outputs a pair of the first and second determination reference signals as the first latch signal, and
    wherein the second latch circuit generates third and fourth determination reference signals in logic state opposite to the logic state of the first or second determination reference signal and outputs a pair of the third and fourth determination reference signals as the second latch signal.

6. The bit refresh circuit according to claim 5,
    wherein the first latch circuit comprises:
    a first flip-flop receiving the input signal, latching the input signal in response to the set signal, and outputting the first determination reference signal; and
    a second flip-flop receiving the input signal, latching the input signal in response to the set signal, and outputting the second determination reference signal, and
    wherein the second latch circuit comprises:
    a first inverter inverting the input signal;
    a third flip-flop receiving an output of the first inverter, latching the output of the first inverter in response to the set signal, and outputting the third determination reference signal;
    a second inverter inverting the input signal; and
    a fourth flip-flop receiving an output of the second inverter, latching the output of the second inverter in response to the set signal, and outputting the fourth determination reference signal.

7. The bit refresh circuit according to claim 6,
    wherein the determination circuit comprises:

a first XOR logic circuit performing a first XOR operation on the first and second determination reference signals and outputting a first XOR operation result signal;

a second XOR logic circuit performing a second XOR operation on the third and fourth determination reference signals and outputting a second XOR operation result signal;

an XNOR logic circuit performing an XNOR operation on one of the first and second determination reference signals and one of the third and fourth determination reference signals and outputting an XNOR operation result signal;

an OR logic circuit performing an OR operation on the first XOR operation result signal, the second XOR operation result signal, and the XNOR operation result signal and outputting an OR operation result signal; and an inverter inverting the OR operation result signal and outputting the inverted OR operation result signal as the refresh determination signal.

8. An integrated circuit device for refreshing register bit values comprising:

a refresh unit receiving input signals, outputting initially-set bit signals, periodically checking the initially-set bit signals and outputting a signal equal to each of the initially-set bit signals as a to-be-refreshed bit signal for each bit if states of the initially-set bit signals are different from initially set states;

a register receiving the initially-set bit signals to set each of the bit signals, receiving the to-be-refreshed bit signals to set the bit signals again, and outputting the set bit signals as control signals; and a logic circuit performing a predetermined logic operation in response to the control signals and outputting a result of the logic operation.

9. The integrated circuit device according to claim 8,
wherein the integrated circuit device further comprises a memory storing externally received input signals and outputting the input signals to the refresh unit.

10. The integrated circuit device according to claim 8,
wherein the refresh unit comprises a plurality of refresh circuits outputting the initially-set bit signals and the to-be-refreshed bit signal, and
wherein each of the refresh circuits comprises:

a first latch circuit receiving one of the input signals, latching the input signal in response to a set signal, outputting a first latch signal;

a second latch circuit receiving the input signal, latching an inverted signal of the input signal in response to the set signal, and outputting a second latch signal;

a determination circuit generating a refresh determination signal by using the first and second latch signals;

a flip-flop receiving the refresh determination signal, latching the refresh determination signal in response to a refresh clock signal, and outputting the refresh determination signal as a determination result signal;

an OR logic circuit performing an OR operation on a refresh verification signal and the determination result signal and outputting an OR operation result signal; and a NAND logic circuit performing a NAND operation on an initial signal and the OR operation result signal and outputting the NAND operation result signal as the set signal.

11. A method of refreshing register bit values, comprising:
receiving an input signal, latching the input signal in response to a set signal, and outputting a first latch signal;

receiving the input signal, latching an inverted signal of the input signal in response to the set signal, and outputting a second latch signal;

generating a refresh determination signal by using the first and second latch signals;

receiving the refresh determination signal, latching the refresh determination signal in response to a refresh clock signal, and outputting the latched refresh determination signal as a determination result signal;

performing an OR operation on a refresh verification signal and the determination result signal and outputting an OR operation result signal; and performing a NAND operation on an initial signal and the OR operation result signal and outputting the NAND operation result signal as the set signal.

12. The method of refreshing register bit values according to claim 11,
wherein the determination result signal is reset to a first logic state in response to a reset signal,
wherein the set signal is set to a second logic state in response to the initial signal being in the first state when the determination result signal is reset, and
wherein the first latch signal is output as a bit signal initially-set to a register in response to the set signal being in the second logic state.

13. The method of refreshing register bit values according to claim 11,
wherein a logical state of the refresh determination signal is determined depending on whether or not the second latch signal is equal to an inverted signal of the first latch signal,
wherein, in response to the refresh verification signal being in the first logic state when the refresh determination signal is in the first logic state; the first latch signal is output as a to-be-refreshed bit signal, and
wherein, when the refresh determination signal is in the second logic state, the first and second latch signals are maintained in the previous states.

14. The method of refreshing register bit values according to claim 13,
wherein the logic state of the refresh determination signal is determined every period of the refresh clock signal.

15. The method of refreshing register bit values according to claim 11,
wherein the first latch signal comprises a pair of first and second determination reference signals in the same logic states generated by using different logic circuits, and
wherein the second latch signal comprises a pair of third and fourth determination reference signals in logic state opposite to the logic state of the first or second determination reference signal.

16. The method of refreshing register bit values according to claim 15,
wherein the outputting of the first latch signal comprises:
receiving the input signal, latching the input signal in response to the set signal, and outputting the first determination reference signal; and
receiving the input signal, latching the input signal in response to the set signal, and outputting the second determination reference signal, and
wherein the outputting of the second latch signal comprises:
inverting the input signal and outputting a first inverted signal;
receiving the first inverted signal of the input signal, latching first inverted signal of the input signal in response to the set signal, and outputting the third determination reference signal.

inverting the input signal and outputting a second inverted signal;

receiving the second inverted signal of the input signal, latching second inverted signal of the input signal in response to the set signal, and outputting the fourth determination reference signal.

17. The method of refreshing register bit values according to claim 16, wherein the generating of the refresh determination signal comprises:

performing a first XOR operation on the first and second determination reference signals and outputting a first XOR operation result signal;

performing a second XOR operation on the third and fourth determination reference signals and outputting a second XOR operation result signal; performing an XNOR operation on one of the first and second determination reference signals and one of the third and fourth determination, reference signals and outputting an XNOR operation result signal;

performing an OR operation on the first XOR operation result signal, the second XOR operation result signal, and the XNOR operation result signal and outputting an OR operation result signal; and inverting the OR operation result signal and outputting the inverted OR operation result signal as the refresh determination signal.

18. A method of driving an integrated circuit, comprising:

receiving input signals and outputting initially-set bit signals;

periodically checking the initially-set bit signals and outputting a signal equal to each of the initially-set bit signals as a to-be-refreshed bit signal for each bit if states of the initially-set bit signals are different from initially-set states;

receiving the initially-set bit signals to set each of the bit signals, receiving the to-be-refreshed bit signals to set the bit signals again, and outputting the set bit signals as control signals; and performing a predetermined logic operation in response to the control signals and outputting a result of the logic operation.

19. The method of driving an integrated circuit according to claim 18, wherein the method further comprises providing the input signal by a memory storing the externally-received input signals.

20. The method of driving an integrated circuit according to claim 18, wherein the outputting of the to-be-refreshed bit signal comprise:

receiving one of the input signals, latching the input signal in response to a set signal, outputting a first latch signal;

receiving the input signal, latching an inverted signal of the input signal in response to the set signal, and outputting a second latch signal;

generating a refresh determination signal by using the first and second latch signals;

receiving the refresh determination signal, latching the refresh determination signal in response to a refresh clock signal, and outputting the latched refresh determination signal as a determination result signal;

performing an OR operation on a refresh verification signal and the determination result signal and outputting an OR operation result signal; and performing a NAND operation on an initial signal and the OR operation result signal and outputting the NAND operation result signal as the set signal.

* * * * *